United States Patent
Seo

(10) Patent No.: US 12,243,760 B2
(45) Date of Patent: Mar. 4, 2025

(54) SUBSTRATE PROCESSING APPARATUS

(71) Applicant: BEILab corp., Ansan-si (KR)

(72) Inventor: Jihyun Seo, Suwon-si (KR)

(73) Assignee: BEILab corp., Ansan-si (KR)

( * ) Notice: Subject to any disclaimer, the term of this patent is extended or adjusted under 35 U.S.C. 154(b) by 532 days.

(21) Appl. No.: 17/569,009

(22) Filed: Jan. 5, 2022

(65) Prior Publication Data
US 2022/0223439 A1 Jul. 14, 2022

(30) Foreign Application Priority Data
Jan. 14, 2021 (KR) ........................ 10-2021-0005380

(51) Int. Cl.
*H01L 21/67* (2006.01)
*H01L 21/687* (2006.01)

(52) U.S. Cl.
CPC .. *H01L 21/67201* (2013.01); *H01L 21/67126* (2013.01); *H01L 21/68764* (2013.01); *H01L 21/68792* (2013.01)

(58) Field of Classification Search
None
See application file for complete search history.

(56) References Cited

U.S. PATENT DOCUMENTS

| 4,797,054 | A | * | 1/1989 | Arii | H01L 21/67126 414/217 |
| 5,314,574 | A | * | 5/1994 | Takahashi | H01L 21/67751 438/743 |
| 6,254,328 | B1 | * | 7/2001 | Wytman | H01L 21/67748 414/217 |

FOREIGN PATENT DOCUMENTS

KR 10-1137665 B1 4/2012
KR 20120100018 A * 9/2012

* cited by examiner

*Primary Examiner* — Karla A Moore
(74) *Attorney, Agent, or Firm* — NKL LAW; Jae Youn Kim

(57) ABSTRACT

The present disclosure provides a substrate processing apparatus including: a load lock chamber configured to accommodate a substrate and be sealed in a vacuum state; a reaction chamber configured to accommodate the load lock chamber; and an opening/closing member extending toward the load lock chamber accommodated in the reaction chamber and configured to open or close the load lock chamber.

13 Claims, 5 Drawing Sheets

SUBSTRATE PROCESSING APPARATUS

CROSS-REFERENCE TO RELATED APPLICATIONS

This application claims the priority of Korean Patent Application No. 10-2021-0005380 filed on Jan. 14, 2021, in the Korean Intellectual Property Office, the disclosure of which is incorporated herein by reference.

BACKGROUND

Field

The present disclosure relates to a substrate processing apparatus, and more particularly, to a substrate processing apparatus capable of loading and unloading a load lock chamber, which accommodates a substrate, into/from a chamber housing.

Description of the Related Art

A substrate processing apparatus (e.g., a semiconductor manufacturing apparatus) serves to perform a process of forming a film on a substrate accommodated in a chamber maintained at a vacuum.

The substrate processing apparatus is installed in a clean room capable of maintaining high cleanliness. The interior of the chamber accommodating the substrate is also maintained in a vacuum ambience (vacuum environment) capable of maintaining high cleanliness and minimizing contamination caused by outside air.

There is a problem in that the substrate may be contaminated or react with gas in a surrounding environment at the time of loading or unloading the substrate into/from the chamber.

Meanwhile, the substrate processing apparatus in the related art separately includes chambers such as a buffer device, a load lock chamber, and a process module in order to minimize contamination that may be caused at the time of loading and unloading the substrate into/from the chamber.

That is, to minimize the contamination and the reaction (such as oxidation) caused during a process of transferring the substrate, the substrate processing apparatus in the related art needs to have the plurality of chambers disposed side by side or sequentially.

The substrate processing apparatus in the related art has a problem in that a space for the plurality of chambers needs to be ensured.

In addition, there is a problem in that the substrate may be contaminated by being exposed to the atmospheric environment or react with gas (e.g., oxidizes) during the process of transferring the substrate even though the substrate processing apparatus in the related art has the plurality of chambers.

For example, Korean Patent No. 10-1137665 discloses a load lock chamber in the related art.

SUMMARY

An object to be achieved by the present disclosure is to provide a substrate processing apparatus capable of minimizing a space required to install the substrate processing apparatus.

Another object to be achieved by the present disclosure is to provide a substrate processing apparatus capable of more assuredly preventing contamination and oxidation of a substrate because a load lock chamber accommodating the substrate is accommodated in a reaction chamber.

Still another object to be achieved by the present disclosure is to provide a substrate processing apparatus capable of easily opening and closing a load lock chamber in a state in which the load lock chamber is accommodated in a reaction chamber.

Yet another object to be achieved by the present disclosure is to provide a substrate processing apparatus capable of loading a substrate into a reaction chamber and unloading the substrate from the reaction chamber in a state in which the substrate is accommodated in a load lock chamber maintained in a vacuum state.

According to an aspect of the present disclosure, there is provided a substrate processing apparatus including: a load lock chamber configured to accommodate a substrate and be sealed in a vacuum state; a reaction chamber configured to accommodate the load lock chamber; and an opening/closing member extending toward the load lock chamber accommodated in the reaction chamber and configured to open or close the load lock chamber.

Therefore, since the movable (i.e., transferable) load lock chamber is accommodated in the reaction chamber, it is possible to prevent contamination and an unnecessary reaction with outside gas that may occur during a process of transferring the substrate.

In addition, the load lock chamber may be opened or closed by the opening/closing member in a state in which the inside of the reaction chamber is maintained in a vacuum state. Therefore, the substrate in the load lock chamber may be always placed under a vacuum environment.

The load lock chamber may include first and second casings configured to be coupled to or separated from each other by rotating, one of the first and second casings may have a second coupling portion, and a first coupling portion formed at one end the opening/closing member may be rotatably coupled to the second coupling portion.

Therefore, the first and second casings of the load lock chamber accommodated in the reaction chamber in a vacuum state may be separated from each other by the opening/closing member, and the substrate in the load lock chamber may be exposed to the reaction space in the reaction chamber.

In addition, the first and second casings may be coupled to each other in an upward/downward direction, and the second coupling portion may be formed at a central portion in a radial direction of an upper surface of the second casing. Further, the opening/closing member may be a shaft extending toward the second coupling portion while penetrating an upper surface of the reaction chamber.

Therefore, the second casing may be easily separated from the first casing as the first coupling portion formed at one end of the shaft is coupled to the second coupling portion of the second casing.

In addition, the first coupling portion of the shaft may be coupled to the second coupling portion of the second casing by rotating in a first direction, and the second casing may be coupled to the first casing by rotating in a second direction opposite to the first direction.

Therefore, the rotation of the shaft in the first direction may fix one end of the shaft to the second casing and easily separate the second casing from the first casing. In addition, the rotation of the shaft in the second direction may couple the second casing to the first casing and easily separate one end of the shaft from the second casing.

The substrate processing apparatus according to the present disclosure may further include a push bar extending toward the second casing while penetrating the upper surface of the reaction chamber, a push groove may be formed in the upper surface of the second casing and disposed at a position eccentric from the second coupling portion, and one end of the push bar may be selectively coupled to the push groove.

Therefore, the shaft may be separated from the second casing when the shaft is continuously rotated in the second direction in a state in which the rotation of the second casing is prevented by the push bar after the second casing is coupled to the first casing by the rotation of the shaft in the second direction.

The reaction chamber may include: a lower chamber part to which the load lock chamber is separably coupled; a chamber body coupled to the lower chamber part and configured to divide a lateral side of the reaction space; and a chamber cover configured to cover an upper end of the chamber body. Further, the opening/closing member may penetrate the chamber cover, and one end of the opening/closing member may extend toward the load lock chamber.

The other end of the opening/closing member may be exposed to the outside of the reaction chamber. Therefore, at least one of a movement force in a longitudinal direction (vertical direction) and a rotational force may be applied to the other end of the opening/closing member by a user or a power transmission device.

The opening/closing member and the push bar may be moved in the upward/downward direction manually or automatically, and the opening/closing member may be selectively rotated manually or automatically in the first and second directions.

According to the present disclosure, it is possible to provide the substrate processing apparatus capable of minimizing the space required to install the substrate processing apparatus.

In addition, the present disclosure may provide the substrate processing apparatus capable of more assuredly preventing the contamination and oxidation of the substrate because the load lock chamber accommodating the substrate is accommodated in the reaction chamber.

In addition, the present disclosure may provide the substrate processing apparatus capable of easily opening and closing the load lock chamber in the state in which the load lock chamber is accommodated in the reaction chamber.

In addition, according to the present disclosure, it is possible to more assuredly prevent the contamination of the substrate during the process of transferring the substrate because the substrate is loaded into the reaction chamber and unloaded from the reaction chamber in the state in which the substrate is accommodated in the load lock chamber maintained in a vacuum state.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
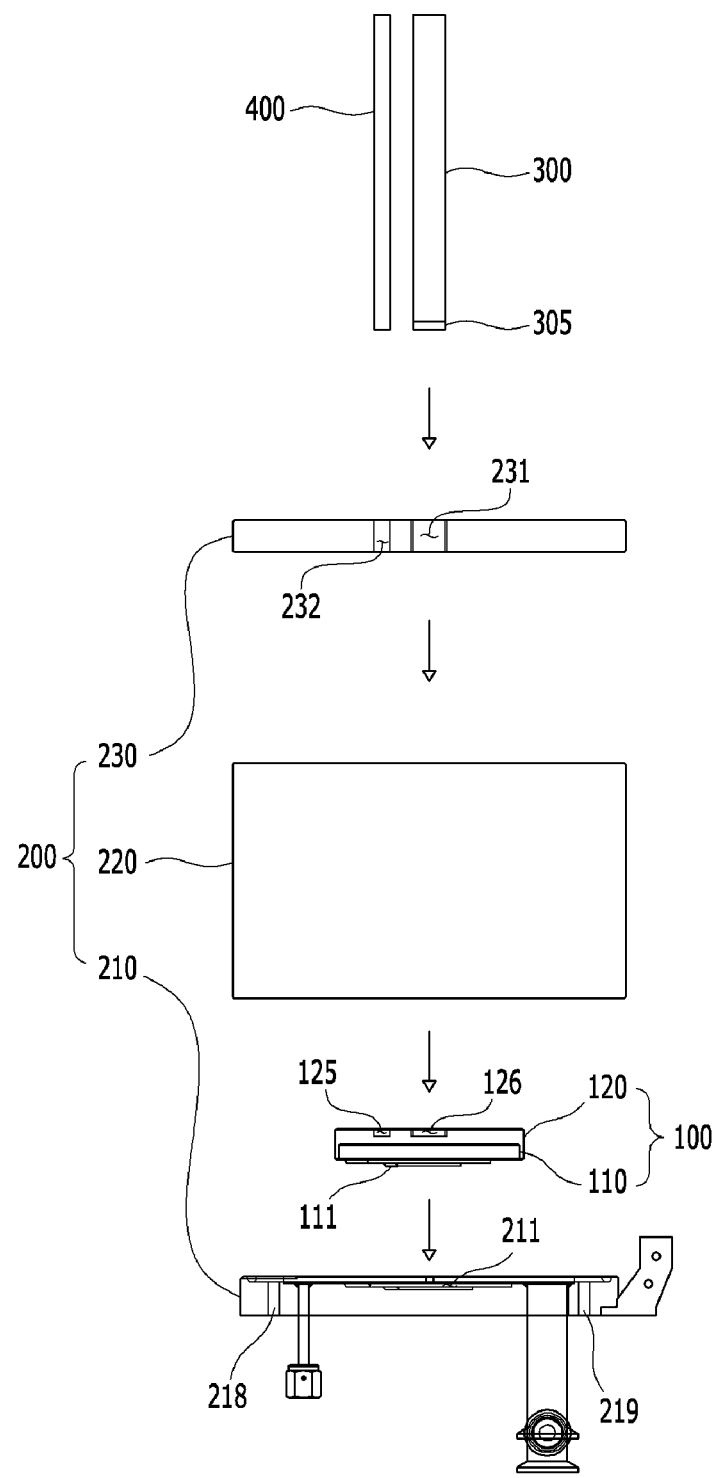
FIG. 1 is a cross-sectional view illustrating a state in which a substrate processing apparatus according to the present disclosure is disassembled.

Hereinafter, a substrate processing apparatus according to an embodiment of the present disclosure will be described in detail with reference to the accompanying drawings. The accompanying drawings illustrate exemplary forms of the present disclosure and are provided merely to describe the present disclosure in more detail, and the drawings do not limit the technical scope of the present disclosure.

In addition, the same or similar constituent elements are assigned with the same reference numerals regardless of reference numerals, and the repetitive description thereof will be omitted. For the convenience of description, sizes and shapes of the respective illustrated constituent members may be exaggerated or reduced.

Meanwhile, the terms including ordinal numbers such as "first" and "second" may be used to describe various constituent elements, but the constituent elements should not be limited by the terms, and these terms are used only to distinguish one constituent element from another constituent element.

FIG. 1 is a cross-sectional view illustrating a state in which a substrate processing apparatus according to the present disclosure is disassembled.

Referring to FIG. 1, the substrate processing apparatus according to the present disclosure may include a load lock chamber 100 configured to accommodate a substrate, a reaction chamber 200 configured to accommodate the load lock chamber 100, and an opening/closing member 300 extending toward the load lock chamber 100 and configured to open or close the load lock chamber 100.

The load lock chamber 100, the reaction chamber 200, and the opening/closing member 300 may be made of a metallic material.

The load lock chamber 100 may be formed to accommodate the substrate (e.g., a sample substrate which is a processing object). The load lock chamber 100 includes a first casing 110 on which the substrate is placed, and a second casing 120 separably coupled to the first casing 110. For example, the first casing 110 and the second casing 120 may be a lower casing and an upper casing, respectively. That is, the first casing 110 and the second casing 120 may be coupled to each other in an upward/downward direction.

The second casing 120 may be coupled to and separated from the first casing 110 by rotating. For example, a screw thread may be formed on an outer peripheral surface of the first casing 110, and a screw thread may be formed on an inner peripheral surface of the second casing 120, such that the second casing 120 may be coupled to and separated from the first casing 110 by rotating.

Specifically, the first casing 110 may have a bottom wall and a first sidewall extending from the bottom wall, and the second casing 120 may have an upper wall and a second sidewall extending from the upper wall. The second sidewall may be formed to surround the first sidewall. That is, the second sidewall may be disposed radially outward from the first sidewall. In other words, a diameter of the upper wall may be larger than a diameter of the bottom wall.

Further, a first screw thread may be formed on an outer surface of the sidewall of the first casing 110, and a second screw thread may be formed on an inner surface of the sidewall of the second casing 120 and engage with the first screw thread.

The load lock chamber 100 may be sealed in a vacuum state as the second casing 120 and the first casing 110 are coupled. Although not illustrated, a sealing member such as a sealing ring may be provided on at least one of the first casing 110 and the second casing 120 to seal the load lock chamber 100 in a vacuum state.

That is, the load lock chamber 100 may accommodate the substrate in a state in which a vacuum is maintained in the load lock chamber 100 in a sealed state (i.e., in the state in which the second casing 120 and the first casing 110 are coupled). For example, the load lock chamber 100 accommodating the substrate may be accommodated in the reaction chamber 200 in the state in which a vacuum is maintained in the load lock chamber 100.

For example, the load lock chamber 100 may be sealed in a vacuum state as the substrate is disposed in the first casing 110, in a vacuum space in which the substrate manufactured, and then the second casing 120 and the first casing 110 are coupled.

The reaction chamber 200 may be formed to accommodate the load lock chamber 100. In addition, the reaction chamber 200 may be connected to a supply source (not illustrated) for supplying a reactant gas (e.g., source gas) into the reaction chamber 200 and connected to a gas discharge unit (not illustrated) including a gas discharge line and a gas discharge pump for discharging the gas from the inside of the reaction chamber 200.

The reaction chamber 200 includes a lower chamber part 210 to which the load lock chamber 100 is separably coupled, a chamber body 220 separably coupled to the lower chamber part 210, and a chamber cover separably coupled to the chamber body 220.

The lower chamber part 210 may divide a lower side of a reaction space (i.e., a lower wall of the reaction chamber), and the load lock chamber 100 may be separably coupled to the lower chamber part 210. For example, a coupling seat 211 may be disposed at a central portion of the lower chamber part 210 and formed concavely to couple the load lock chamber 100 so that the load lock chamber 100 is separable. Further, a protruding portion 111 may be formed on a lower surface of the load lock chamber 100 (i.e., a lower surface of the first casing) and separably coupled to the coupling seat 211. The first casing 110 may be coupled to the coupling seat 211 so as not to rotate.

The lower chamber part 210 may include: a supply hole 218 connected to a supply line (not illustrated) for supplying the reactant gas into the reaction chamber; and a gas discharge hole 219 connected to the gas discharge line (not illustrated) for discharging the gas from the inside of the reaction chamber. At least one of an on-off valve and an opening degree adjusting valve may be provided in the supply line, and at least one of an on-off valve and an opening degree adjusting valve may be provided in the gas discharge line.

The chamber body 220 may divide a lateral side (or sidewall) of the reaction space and be separably coupled to the lower chamber part 210. In the illustrated embodiment, the chamber body 220 may be formed in a prismatic shape opened at upper and lower ends thereof. However, it is apparent that the shape of the chamber body 220 may be changed to various shapes such as a cylindrical shape. A lower end of the chamber body 220 may be covered by the lower chamber part 210, and an upper end of the chamber body 220 may be covered by the chamber cover 230.

The chamber cover 230 may be formed to cover the upper end of the chamber body 220. That is, the chamber cover 230 may divide an upper side (or an upper wall) of the reaction space. The chamber cover 230 may have a first hole 231 and a second hole 232 penetrated by the opening/closing member 300 and a push bar 400 to be described below. The first hole 231 and the second hole 232 may be sealed in a state in which the opening/closing member 300 and the push bar 400 penetrate the first hole 231 and the second hole 232.

The opening/closing member 300 may extend toward the load lock chamber 100 accommodated in the reaction chamber 200. The opening/closing member 300 may be formed to open or close the load lock chamber 100.

The load lock chamber 100 accommodated in the reaction chamber 200 may be opened or closed in the state in which the inside of the reaction chamber 200 is maintained in a vacuum state. That is, the load lock chamber 100 may be opened or closed in the reaction chamber 200 in a vacuum state.

Therefore, it is possible to prevent unnecessary contamination or oxidation of the substrate accommodated in the load lock chamber 100.

Meanwhile, as described above, the load lock chamber 100 may include the first casing 110 and the second casing 120 coupled to or separated from each other by rotating. In this case, one of the first and second casings 110 and 120 may be formed so that one end of the opening/closing member 300 is separably coupled to one of the first and second casings 110 and 120.

Specifically, a second coupling portion 125 may be formed on one of the first and second casings 110 and 120, and a first coupling portion 305 formed at one end in the longitudinal direction of the opening/closing member 300 may be coupled to the second coupling portion 125. For example, the first and second coupling portions 305 and 125 may have screw threads and be coupled to each other in a screw coupling (rotational coupling) manner.

The other end in the longitudinal direction of the opening/closing member 300 may be exposed to the outside of the reaction chamber 200. That is, the other end of the opening/closing member 300 may protrude toward an upper side of the chamber cover 230 through the first hole 231. This is to transmit a vertical movement force and a rotational force for the opening/closing member 300, which are applied from the outside of the reaction chamber 200, to the opening/closing member 300 through the other end of the opening/closing member 300. That is, when the vertical movement force or rotational force is applied to the other end of the opening/closing member 300 by a user or a power transmission device (not illustrated), the opening/closing member 300 may move or rotate in the vertical direction.

Therefore, after one end of the opening/closing member 300 is rotated and coupled to the second coupling portion 125, the first casing 110 and the second casing 120 may be easily separated by rotating one of the first and second casings 110 and 120.

In the illustrated embodiment, the second coupling portion 125 may be concave formed in an upper surface of the second casing 120. That is, the first coupling portion 305 may have an external thread, and the second coupling portion 125 may have an internal thread. Therefore, one end of the opening/closing member 300 may be coupled to the upper surface of the second casing 120 by being inserted into the second coupling portion 125.

More specifically, the second coupling portion 125 may be formed at a central portion in a radial direction of the upper surface of the second casing 120. Further, the opening/closing member 300 may be a shaft extending toward the second coupling portion 125 while penetrating an upper surface of the reaction chamber 200 (i.e., the chamber cover).

Therefore, the first coupling portion 305 of the opening/closing member 300 may be easily rotated and coupled to the second coupling portion 125 after the opening/closing member 300 is moved downward toward the second coupling portion 125.

A rotation direction of the opening/closing member 300 for coupling the first coupling portion 305 of the opening/closing member 300 to the second coupling portion 125 may be identical to a rotation direction of the second casing 120 for separating the second casing 120 from the first casing 110.

Specifically, the first coupling portion 305 of the opening/closing member (shaft) 300 may be coupled to the second coupling portion 125 of the second casing 120 by rotating in a first direction. In addition, the second casing 120 may be coupled to the first casing 110 by rotating in a second direction opposite to the first direction.

For example, the first direction may be a counterclockwise direction, and the second direction may be a clockwise direction.

Therefore, when the opening/closing member 300 rotates in the first direction in the state in which the first coupling portion 305 and the second coupling portion 125 are in contact with each other, the first coupling portion 305 is coupled to the second coupling portion 125. When the opening/closing member 300 continuously rotates in the first direction, the second casing 120 may be separated from the first casing 110.

The opening/closing member 300 and the load lock chamber 100 (e.g., the first casing 110) may be made of materials having the same strength or the same hardness to prevent abrasion of coupled portions when the opening/closing member 300 is coupled to or separated from the first casing 110.

As described above, the first casing 110 and the second casing 120 may be easily separated by the rotation of the opening/closing member 300 in one direction (i.e., the first direction), and the substrate accommodated in the load lock chamber 100 (i.e., placed in the first casing 110) may be exposed to the reaction space as the second casing 120 fixed to one end of the opening/closing member 300 is moved upward together with the opening/closing member 300.

When the processing is completely performed on the substrate in the reaction space, the second casing 120 needs to be coupled again to the first casing 110 in which the substrate is placed in the state in which the reaction space is maintained in a vacuum state. In this case, the second casing 120 may be coupled to the first casing 110 when the opening/closing member 300 is rotated in the second direction (clockwise) after the second casing 120 fixed to one end of the opening/closing member 300 is moved downward toward the first casing 110 together with the opening/closing member 300.

The rotation of the second casing 120 needs to be stopped to separate the opening/closing member 300 from the second casing 120 after the second casing 120 is coupled to the first casing 110.

The substrate processing apparatus according to the present disclosure may further include the push bar 400 extending toward the second casing 120 while penetrating the upper surface of the reaction chamber 200. The push bar 400 may extend through the second hole 232 as described above.

A push groove 126 may be formed in the upper surface of the second casing 120, and one end of the push bar 400 may be selectively coupled to the push groove 126. The push groove 126 may be disposed at a position eccentric from the second coupling portion 125.

In other words, a center in the radial direction of the second coupling portion 125 may be coincident with a center in the radial direction of the second casing 120, and an extension line of an axis of the opening/closing member 300 may pass (in the vertical direction) through the center in the radial direction of the second casing 120.

In addition, the push groove 126 may be disposed to be spaced apart from the second coupling portion 125 in a direction toward the outside of the casing 120 in the radial direction. That is, the center of the push groove 126 may be disposed between the center in the radial direction of the casing 120 and an outer periphery of the casing 120.

One end of the push bar 400 may be coupled to the push groove 126 at the time of separating the opening/closing member 300 from the second casing 120. For example, at the time of separating the opening/closing member 300 from the second casing 120, the second casing 120 may be pressed (downward) by the push bar 400 in the state in which one end of the push bar 400 facing the push groove 126 is coupled to the push groove 126.

The other end in the longitudinal direction of the push bar 400 may protrude toward an upper side of the reaction chamber 200 so as to be exposed to the outside of the reaction chamber 200. That is, the other end of the push bar 400 may protrude toward the upper side of the chamber cover 230 through the second hole 232. This is to transmit a vertical movement force for the push bar 400, which is applied from the outside of the reaction chamber 200, to the push bar 400 through the other end of the push bar 400. That is, when the vertical movement force is applied to the other end of the push bar 400 by the user or the power transmission device (not illustrated), the push bar 400 may be moved in the vertical direction.

The opening/closing member 300 may be separated from the second casing 120 when the opening/closing member 300 is rotated in the second direction in the state in which one end of the push bar 400 is coupled to the push groove 126.

The push bar 400 and the load lock chamber 100 (e.g., the first casing 110) may be made of materials having the same strength or the same hardness to prevent abrasion of coupled portion when the push bar 400 is coupled to or separated from the push groove 126.

According to the present disclosure described above, it is possible to more assuredly prevent the contamination and oxidation of the substrate because the load lock chamber 100 accommodating the substrate is accommodated in the reaction chamber 200. In addition, according to the present disclosure, the load lock chamber 100 may be easily opened or closed in the state in which the load lock chamber 100 is accommodated in the reaction chamber 200.

Hereinafter, a process of opening or closing the load lock chamber 100 in the state in which the load lock chamber 100 is accommodated in the reaction chamber 200 will be described more specifically with reference to another drawing.

Figure 2:
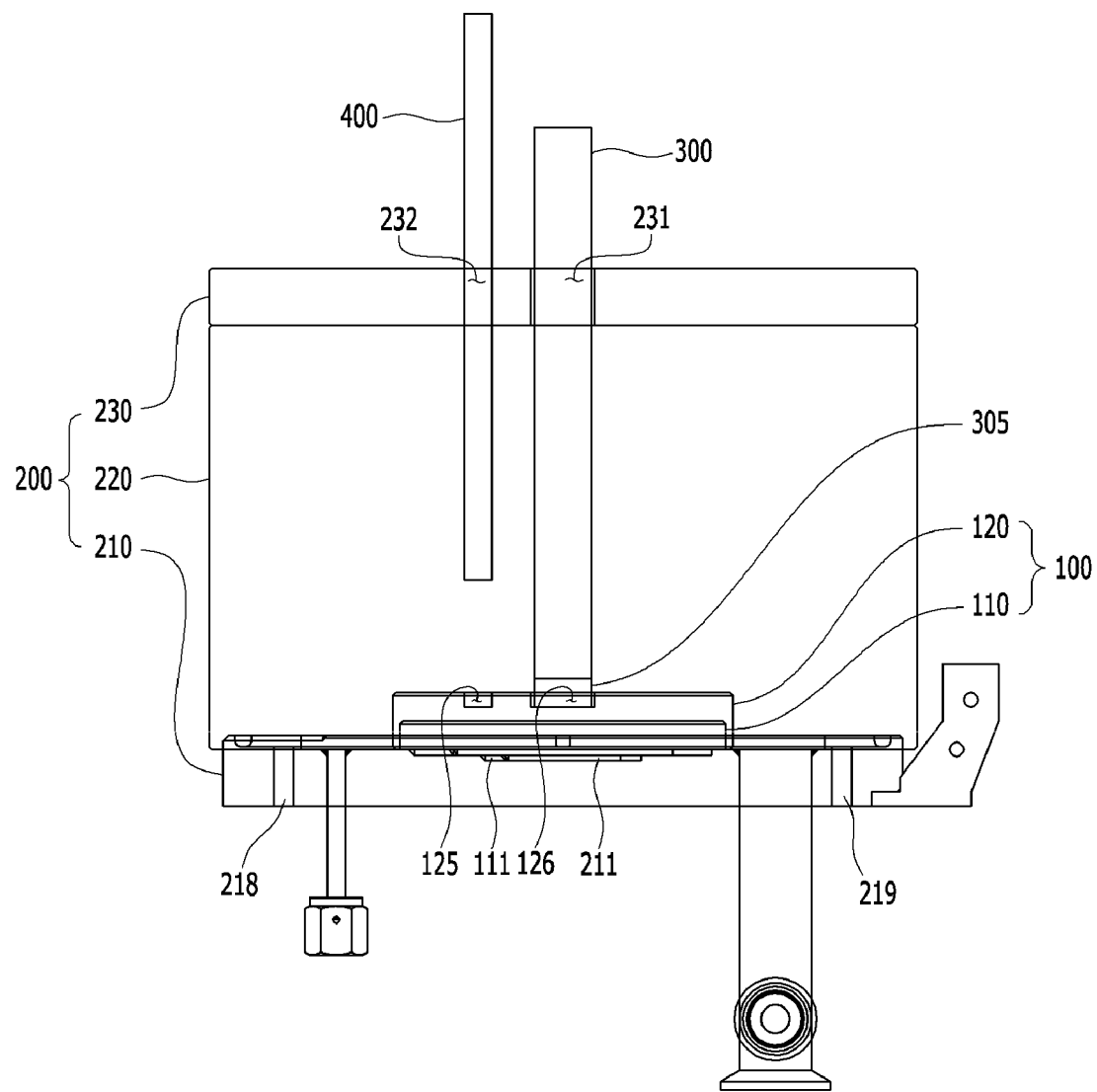
FIG. 2 is a view illustrating a state in which an opening/closing member (shaft) is coupled to a sealed load lock chamber in a state in which the load lock chamber is accommodated in a reaction chamber.

FIG. 2 is a view illustrating a state in which the opening/closing member (shaft) is coupled to the sealed load lock chamber in the state in which the load lock chamber is accommodated in the reaction chamber.

As illustrated in FIG. 1, the sealed load lock chamber 100 may be accommodated in the reaction chamber 200 in the state in which the reaction chamber 200 is separated.

The lower chamber part 210, the chamber body 220, and the chamber cover 230 may be coupled in the state in which the load lock chamber 100 is coupled to the lower chamber part 210. Further, a vacuum may be made in the reaction chamber 200 in the state in which the opening/closing member 300 and the push bar 400 extend through the first hole 231 and the second hole 232.

In this case, the opening/closing member 300 may be moved downward toward the second casing 120 of the load lock chamber 100, and the opening/closing member 300 may be rotated in the first direction (counterclockwise), such that one end of the opening/closing member 300 and the second casing 120 may be coupled to each other.

The upward and downward movements and the rotation of the opening/closing member 300 may be performed manually by a manager or automatically by an automatic drive device disposed outside the substrate processing apparatus and including a cylinder, a motor, and the like.

In the case in which the upward and downward movements and the rotation of the opening/closing member 300 are performed by the automatic drive device, operations of the cylinder, the motor, and the like may be controlled by a non-illustrated control unit.

Hereinafter, a process of opening the load lock chamber 100 will be described with reference to another drawing.

Figure 3:
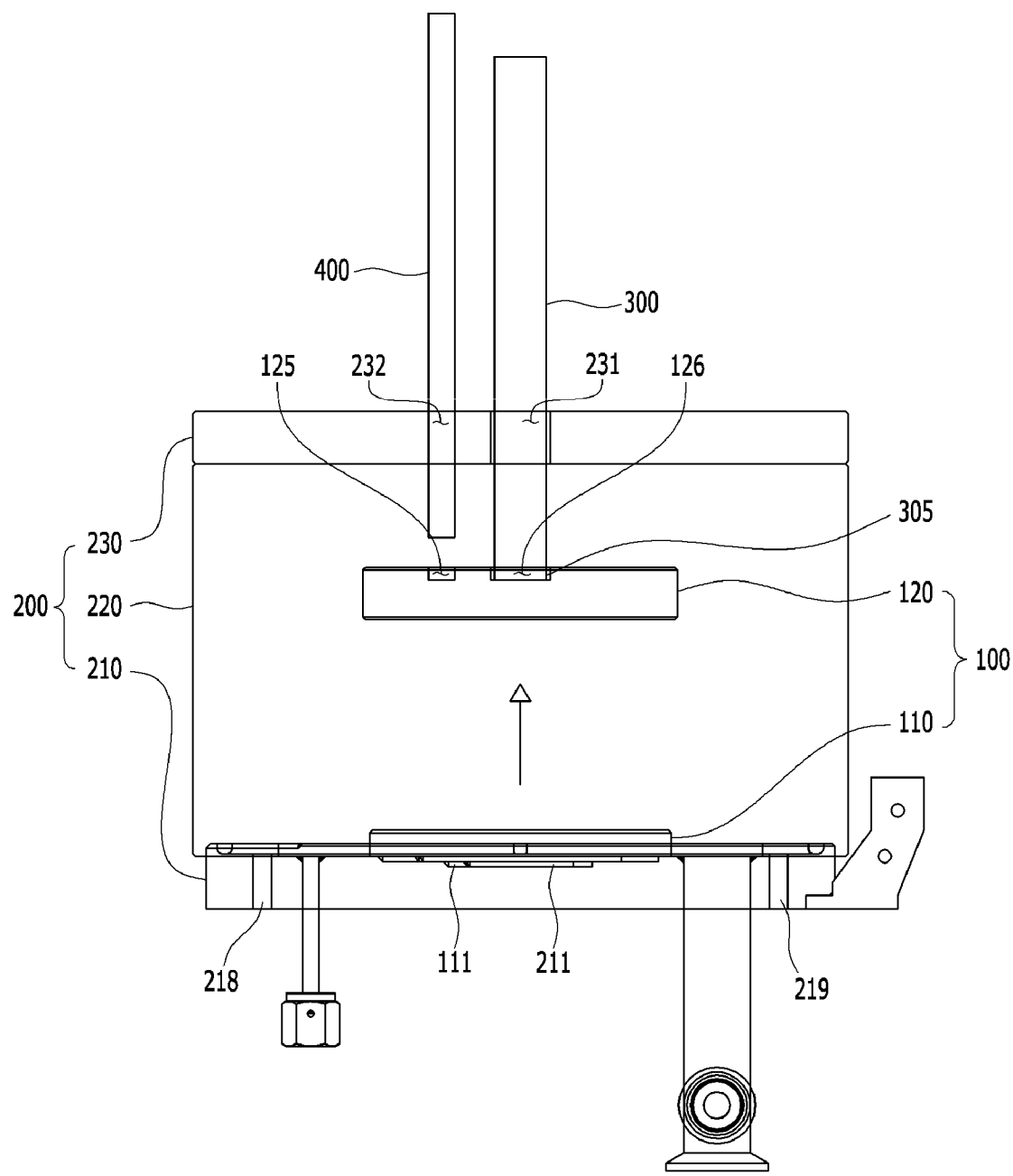
FIG. 3 is a view illustrating a process in which the load lock chamber is opened by the opening/closing member (shaft) in the state in which the load lock chamber is accommodated in the reaction chamber.

FIG. 3 is a view illustrating a process in which the load lock chamber is opened by the opening/closing member (shaft) in the state in which the load lock chamber is accommodated in the reaction chamber.

Referring to FIG. 3, the opening/closing member 300 may be continuously rotated in the first direction after one end of the opening/closing member 300 and the second casing 120 are coupled to each other by the rotation of the opening/closing member 300 in the first direction as illustrated in FIG. 2.

As the opening/closing member 300 is continuously rotated in the first direction, the second casing 120 of the load lock chamber 100 may be separated from the first casing 110.

That is, a rotation direction of the opening/closing member 300 for coupling the opening/closing member 300 to the second casing 120 may be identical to a rotation direction of the second casing 120 for separating the second casing 120 from the first casing 110.

In other words, the rotation direction of the opening/closing member 300 for coupling the opening/closing member 300 to the second casing 120 may be opposite to the rotation direction for coupling the second casing 120 to the first casing 110.

That is, screw threads may be formed on the first coupling portion 305 of the opening/closing member 300 and the second coupling portion 125 of the second casing 120 so that the opening/closing member 300 is coupled to and separated from the second casing 120 by the rotation of the opening/closing member 300. In addition, screw threads may be formed on an inner peripheral surface of a lower end of the second casing 120 and an outer peripheral surface of an upper end of the first casing 110 so that the second casing 120 is coupled to or separated from the first casing 110 by the rotation of the opening/closing member 300.

When the opening/closing member 300 is continuously rotated in the first direction, the second casing 120 of the load lock chamber 100 may be separated from the first casing 110, and then the opening/closing member 300 is moved in a direction away from the first casing 110 (i.e., moved upward), such that the second casing 120 may be moved away from the first casing 110. In this case, the substrate placed in the first casing 110 may be exposed to the reaction space in the reaction chamber 200.

In this state, the reactant gas (source gas) is supplied into the reaction chamber 200, such that the processing (e.g., a deposition process) may be performed on the substrate.

Hereinafter, a process of closing the load lock chamber 100 after the processing is completely performed on the substrate will be described with reference to another drawing.

Figure 4:
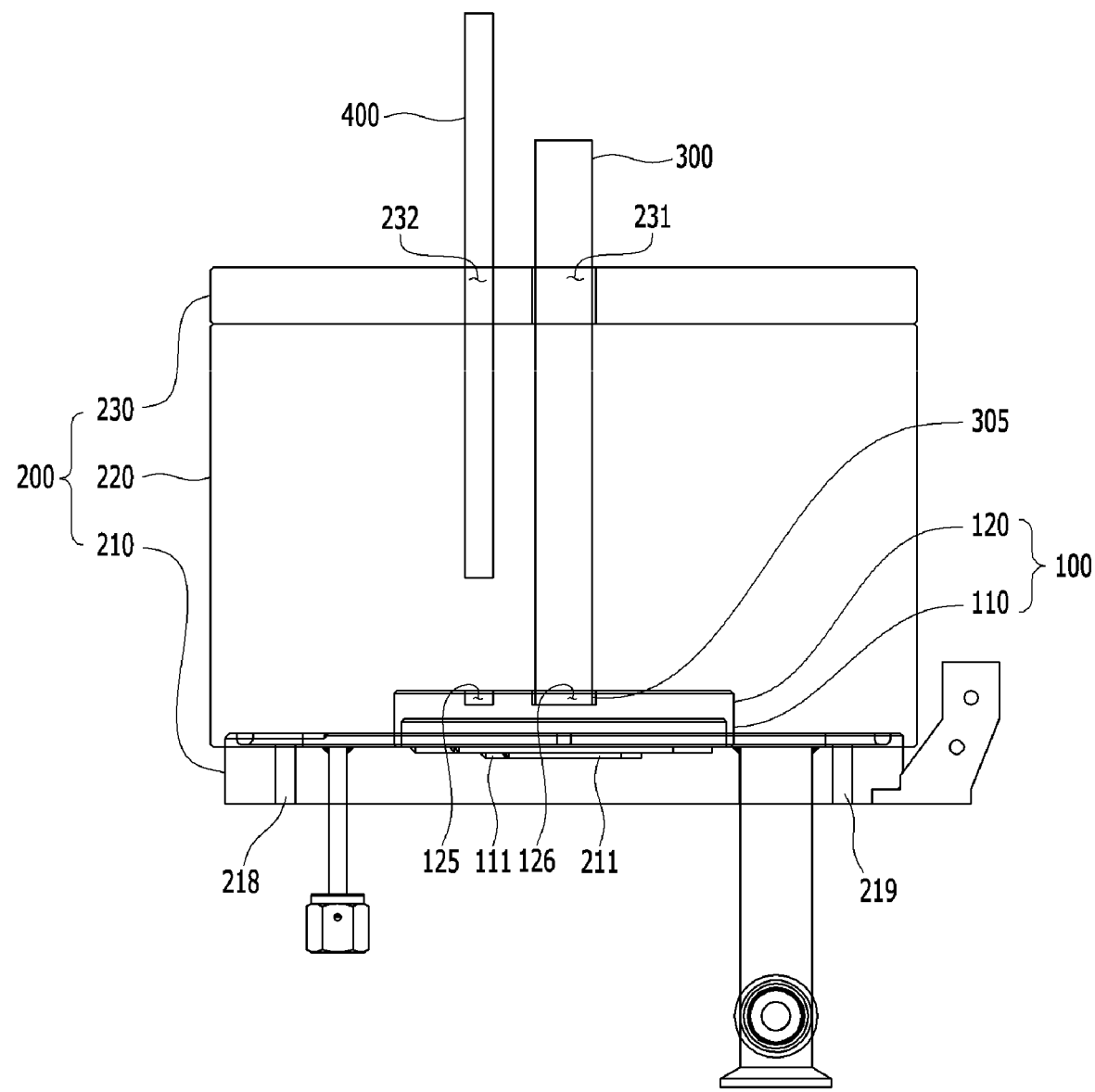
FIG. 4 is a view illustrating a process in which the load lock chamber is closed by the opening/closing member (shaft) in the state in which the load lock chamber is accommodated in the reaction chamber.

FIG. 4 is a view illustrating a process in which the load lock chamber is closed by the opening/closing member (shaft) in the state in which the load lock chamber is accommodated in the reaction chamber.

When the processing is completely performed on the substrate in the reaction space, the reaction space may be maintained in a vacuum state. Further, the opening/closing member 300 coupled to the second casing 120 may be moved downward toward the first casing 110.

When the lower end of the second casing 120 is brought into contact with the upper end of the first casing 110 by the downward movement of the opening/closing member 300, the opening/closing member 300 may be rotated in the second direction (clockwise).

The second casing 120 may be coupled to the first casing 110 by the rotation of the opening/closing member 300 in the second direction. The inside of the load lock chamber 100, in which the substrate is accommodated, may be sealed in a vacuum state as the second casing 120 and the first casing 110 are coupled.

Hereinafter, a process of separating the opening/closing member from the load lock chamber will be described with reference to another drawing.

Figure 5:
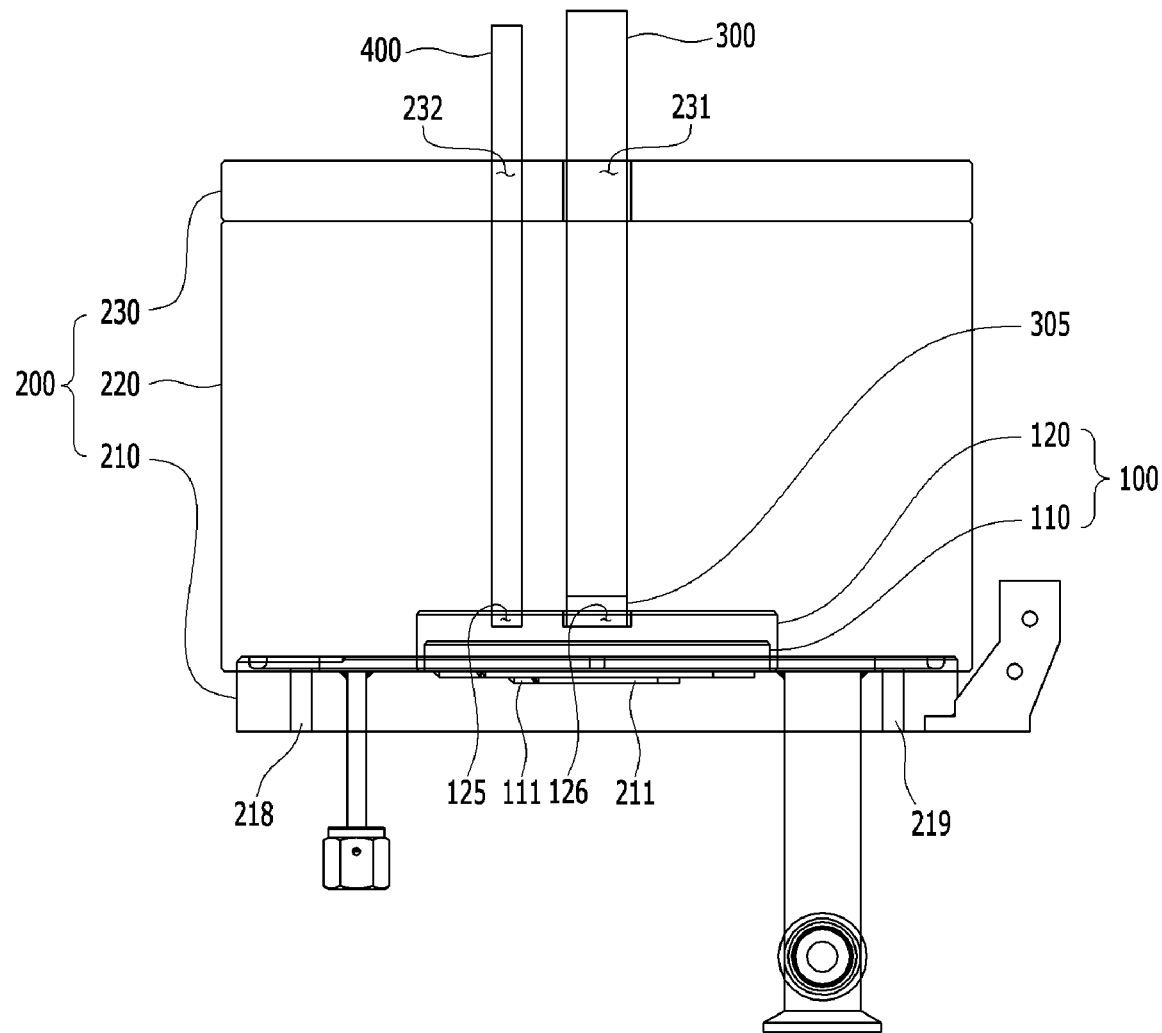
FIG. 5 is a view illustrating a process in which the opening/closing member (shaft) is separated from the load lock chamber in the state in which the load lock chamber is accommodated in the reaction chamber.

FIG. 5 is a view illustrating a process in which the opening/closing member (shaft) is separated from the load lock chamber in the state in which the load lock chamber is accommodated in the reaction chamber.

Referring to FIG. 5, the opening/closing member 300 may be separated from the second casing 120 when the opening/closing member 300 is continuously rotated in the second direction after the second casing 120 is coupled to the first casing 110 by the rotation of the opening/closing member 300 in the second direction as illustrated in FIG. 4.

In this case, the opening/closing member 300 may not be easily separated from the second casing 120 if the load lock chamber 100 is also rotated in the second direction when the opening/closing member 300 is rotated in the second direction.

Therefore, the push bar 400 may move downward toward the push groove 126 formed in the upper surface of the second casing 120 before the opening/closing member 300 is separated from the second casing 120.

Further, the opening/closing member 300 may be easily separated from the second casing 120 when the opening/closing member 300 is rotated in the second direction in the state in which one end of the push bar 400 is inserted into the push groove 126.

That is, the push bar 400 may prevent the second casing 120 from rotating together with the opening/closing member 300 when the opening/closing member 300 rotates. Furthermore, the opening/closing member 300 may be rotated in the second direction in a state in which the push bar 400 presses the load lock chamber 100 downward. In this case, an unnecessary slip (rotational slip) of the load lock chamber 100 may be prevented at the time of separating the opening/closing member 300 from the second casing 120.

After the opening/closing member 300 is separated from the second casing 120, the opening/closing member 300 and the push bar 400 may be moved upward, and the reaction chamber 200 may be opened (i.e., the chamber body may be separated from the lower chamber part) (see FIG. 1). Further, the load lock chamber maintained in a vacuum sealed state and accommodated in the reaction chamber 200 may be transferred to the outside of the reaction chamber.

The upward and downward movements of the push bar 400 may be performed manually or automatically performed by the automatic drive device including the cylinder, the motor, and the like. In the case in which the upward and downward movements of the push bar 400 are performed automatically, the automatic drive device including the cylinder, the motor, and the like may be controlled by the non-illustrated control unit.

The exemplary embodiments of the present disclosure described above may be various modified, changed, and altered within the spirit and scope of the present disclosure by those skilled in the art to which the present disclosure pertains, and the modifications, changes, and alterations belong to the appended claims.

What is claimed is:

1. A substrate processing apparatus comprising:
   a load lock chamber configured to accommodate a substrate and be sealed in a vacuum state;
   a reaction chamber configured to accommodate the load lock chamber; and
   a shaft extending toward the load lock chamber accommodated in the reaction chamber and configured to open or close the load lock chamber,
   wherein the shaft has a first coupling portion formed at one end thereof,
   wherein the load lock chamber comprises first and second casings configured to be coupled to or separated from each other by rotating, the second casing including a second coupling portion,
   wherein the first coupling portion of the shaft is coupled to the second coupling portion of the second casing by rotating in a first direction, and
   wherein the second casing is coupled to the first casing by rotating in a second direction opposite to the first direction.

2. The substrate processing apparatus of claim 1, wherein the load lock chamber is opened or closed by the shaft in a state in which an inside of the reaction chamber is maintained in a vacuum state.

3. The substrate processing apparatus of claim 1, wherein the first and second casings are coupled to each other in an upward/downward direction, the second coupling portion is formed at a central portion in a radial direction of an upper surface of the second casing, and the shaft extends toward the second coupling portion while penetrating an upper surface of the reaction chamber.

4. The substrate processing apparatus of claim 3, further comprising:
   a push bar extending toward the second casing while penetrating the upper surface of the reaction chamber,
   wherein a push groove is formed in the upper surface of the second casing and disposed at a position eccentric from the second coupling portion, and wherein one end of the push bar is selectively coupled to the push groove.

5. The substrate processing apparatus of claim 1, wherein the reaction chamber comprises:
   a lower chamber part to which the load lock chamber is separably coupled;
   a chamber body coupled to the lower chamber part and configured to divide a lateral side of a reaction space of the reaction chamber; and
   a chamber cover configured to cover an upper end of the chamber body, and
   wherein the shaft penetrates the chamber cover, and wherein the one end of the shaft extends toward the load lock chamber.

6. The substrate processing apparatus of claim 5, wherein the other end of the shaft is exposed to the outside of the reaction chamber.

7. The substrate processing apparatus of claim 1, further comprising:
   a push bar extending toward the second casing while penetrating an upper surface of the reaction chamber,
   wherein a push groove is formed in an upper surface of the second casing and disposed at a position eccentric from the second coupling portion, and wherein one end of the push bar is selectively coupled to the push groove.

8. A substrate processing apparatus comprising:
   a load lock chamber configured to accommodate a substrate;
   a reaction chamber in which the load lock chamber is separably accommodated; and
   a shaft extending toward the load lock chamber to open or close the load lock chamber in a state in which the load lock chamber is accommodated in the reaction chamber,
   wherein the shaft has a first coupling portion formed at one end thereof,
   wherein the load lock chamber has a second coupling portion,
   wherein the first coupling portion is rotatably coupled to the second coupling portion,
   wherein the load lock chamber comprises first and second casings configured to be coupled to or separated from each other by rotating,
   wherein the first coupling portion is coupled to the second coupling portion provided on the second casing by rotating in a first direction, and
   wherein the second casing is coupled to the first casing by rotating in a second direction opposite to the first direction.

9. The substrate processing apparatus of claim 8, wherein the shaft extends straight toward the load lock chamber.

10. The substrate processing apparatus of claim 8, wherein the shaft is coupled to or separated from the load lock chamber as the shaft rotates.

11. The substrate processing apparatus of claim 8, further comprising:
    a push bar extending toward the second casing,
    wherein the second coupling portion is formed at a central portion in a radial direction of an upper surface of the second casing,
    wherein a push groove is formed in the upper surface of the second casing and disposed at a position eccentric from the second coupling portion, and
    wherein one end of the push bar is selectively coupled to the push groove.

12. The substrate processing apparatus of claim 8, wherein the other end of the shaft is exposed to the outside of the reaction chamber.

13. A substrate processing apparatus comprising:
- a load lock chamber configured to accommodate a substrate and be sealed in a vacuum state;
- a reaction chamber configured to accommodate the load lock chamber;
- a shaft extending toward the load lock chamber accommodated in the reaction chamber and configured to open or close the load lock chamber,
  - wherein the shaft has a first coupling portion formed at one end thereof,
  - wherein the load lock chamber comprises first and second casings configured to be coupled to or separated from each other by rotating,
  - wherein one of the first and second casings has a second coupling portion,
  - wherein the first coupling portion is rotatably coupled to the second coupling portion, and
  - wherein the first and second casings are coupled to each other in an upward/downward direction, the second coupling portion is formed at a central portion in a radial direction of an upper surface of the second casing, and the shaft extends toward the second coupling portion while penetrating an upper surface of the reaction chamber; and
- a push bar extending toward the second casing while penetrating the upper surface of the reaction chamber,
  - wherein a push groove is formed in the upper surface of the second casing and disposed at a position eccentric from the second coupling portion, and
  - wherein one end of the push bar is selectively coupled to the push groove.

* * * * *